United States Patent
Hartmann et al.

(10) Patent No.: US 7,535,151 B2
(45) Date of Patent: May 19, 2009

(54) SINGLE PHASE UNIDIRECTIONAL SURFACE ACOUSTIC WAVE TRANSDUCER AND IMPROVED REFLECTORS

(76) Inventors: Clinton S. Hartmann, 5419 Ridgedale Dr., Dallas, TX (US) 75206; Viktor P. Plesski, GVR Trade SA, Chemin du Vignoble, 31C, 2022 Bevaix (CH)

( * ) Notice: Subject to any disclaimer, the term of this patent is extended or adjusted under 35 U.S.C. 154(b) by 0 days.

(21) Appl. No.: 11/640,027

(22) Filed: Dec. 18, 2006

(65) Prior Publication Data

US 2007/0096593 A1     May 3, 2007

Related U.S. Application Data

(62) Division of application No. 10/961,758, filed on Oct. 8, 2004, now Pat. No. 7,173,360.

(60) Provisional application No. 60/509,693, filed on Oct. 8, 2003.

(51) Int. Cl.
    *H03H 9/25* (2006.01)
(52) U.S. Cl. ................................................. 310/313 D
(58) Field of Classification Search .............. 310/313 D
    See application file for complete search history.

(56) References Cited

U.S. PATENT DOCUMENTS

| 4,393,358 | A * | 7/1983 | DeVries .................... 333/194 |
| 4,620,167 | A * | 10/1986 | Brooks et al. .............. 333/195 |
| 6,958,696 | B2 * | 10/2005 | Hartmann et al. ......... 340/572.1 |
| 7,100,451 | B2 * | 9/2006 | Solie ........................... 73/703 |
| 2005/0121999 | A1 * | 6/2005 | Edmonson et al. ...... 310/313 D |

FOREIGN PATENT DOCUMENTS

JP        02-272817       * 11/1990

* cited by examiner

*Primary Examiner*—Thomas M. Dougherty (57) ABSTRACT

A unidirectional transducer for a surface acoustic wave (SAW) device. In one embodiment the device includes (1) a defined area on a piezoelectric substrate within which is located an open circuit reflector perpendicular to the SAW direction of propagation; and a pair of low reflectivity transducer electrodes located within the defined area and connected to opposing bus bars, the electrodes perpendicular to the direction of the SAW propagation and positioned with the excitation center of the pair of electrodes located about seven-eighths of a Rayleigh wavelength at a center frequency of the SAW from the reflector.

18 Claims, 10 Drawing Sheets

CORRESPONDS TO ~1464 λ ON 128° LiNbO₃ WHICH IS NEAR BEGINNING OF FIRST TAG REFLECTORS

*FIG. 8A*

CORRESPONDS TO ~1950 λ ON 128° LiNbO₃ WHICH IS IN THE 1st HALF OF FIRST TAG REFLECTORS

*FIG. 8B*

CORRESPONDS TO ~2928 λ ON 128° LiNbO₃ WHICH IS IN THE 2nd HALF OF FIRST TAG REFLECTORS

FIG. 8C

CORRESPONDS TO ~3900 λ ON 128° LiNbO₃ WHICH IS NEAR THE END OF FIRST TAG REFLECTORS

FIG. 8D

CORRESPONDS TO ~4880 λ ON 128° LiNbO₃ WHICH IS IN THE 1st HALF OF SECOND TAG REFLECTORS

*FIG. 8E*

CORRESPONDS TO ~6880 λ ON 128° LiNbO₃ WHICH IS SLIGHTLY PAST THE END OF THE SECOND TAG REFLECTORS

SINGLE PHASE UNIDIRECTIONAL SURFACE ACOUSTIC WAVE TRANSDUCER AND IMPROVED REFLECTORS

CROSS-REFERENCE TO RELATED APPLICATION

This Application is a Divisional of prior application Ser. No. 10/961,758 filed on Oct. 8, 2004, now U.S. Pat. No. 7,173,360. The above-listed Application is commonly assigned with the present invention and is incorporated herein by reference as if reproduced herein in its entirety under Rule 1.53(b).

This Application claims the benefit of U.S. Provisional Application Ser. No. 60/509,693 filed on Oct. 8, 2003, entitled "Single Phase Unidirectional Saw Transducer," commonly assigned with the present invention and incorporated herein by reference.

TECHNICAL FIELD OF THE INVENTION

The present invention is directed, in general to surface acoustic wave (SAW) devices and more specifically, to a single-phase unidirectional surface acoustic wave transducer and to improved reflectors for SAW devices.

BACKGROUND OF THE INVENTION

The never ending trend toward smaller electronic devices increases the pressure to develop smaller and more efficient components. For example, wireless communications systems are requiring increasingly enhanced performance from passive components used for signal processing, particularly those operating above one GHz. In the case of SAW filters, characteristics typically demanded include low insertion loss, low passband ripple, high degree of linearity of phase and high selectivity. To meet these demands single-phase unidirectional transducers (SPUDTs) are frequently used. SPUDT devices can also be used for SAW sensors and SAW radio frequency identification tags.

A SPUDT structure calls for the placement of reflectors and transducers in such a way that, within each unit cell, the center of transduction is shifted with respect to the center of reflection. Ideally, this phase shift should be equal to ±one-half of pi ($\pm \pi/2$). In most SPUDT structures, electrodes one-eighth of a Rayleigh SAW wavelength wide and reflectors ranging from one-fourth to three-eighths of a wavelength wide are used to obtain a nonreflecting transduction. In the majority of cases the electrodes are one-eighth of a wavelength or narrower. Consequently, in the GHz range the critical dimensions of electrodes are beyond the limits of feasibility for large scale fabrication techniques based on optical lithography.

For SAW devices operating at 2 GHz and higher frequencies, the wavelength is about 2 μm. Thus, an electrode one-eighth of a wavelength wide has an absolute width of about 0.25 μm. With the thickness ranging from 2% to 10% of a wavelength, the absolute height of the electrode is about 40-200 nm. This small aluminum cross section for the electrode causes resistive losses to become unacceptably high. For this reason, SPUDT transducers are seldom used above 1 Ghz.

Accordingly, what is needed in the art is a low-loss unidirectional transducer that can operate on a substrate at frequencies higher than 1 GHz that can be manufactured utilizing large scale fabrication techniques based on optical lithography.

Also needed in the art are better reflector configurations to use with SAW radio frequency identification tags. In the case of SAW identification tags, it is important that as much of the energy reflected in response to a transducer generated interrogation pulse be captured as possible. If an aluminum reflector located on a substrate is the same size as the transducer and if that reflector is straight and substantially perpendicular to the interrogation pulse, a substantial amount of energy generated by the transducer is not going to be included in the reflected pulse. This is because a portion of the pulse generated by the transducer does not impact a reflector due to the fact that it expands in size as it travels down the SAW tag surface away from the transducer.

Thus, what is needed in the art is a better reflector for use on a SAW tags that have the capability of capturing more of the interrogation pulse energy in order to return a more vigorous reflected signal to the transducer.

SUMMARY OF THE INVENTION

To address the above-discussed deficiencies of the prior art, the present invention provides for a unidirectional transducer for a SAW device. In one embodiment the device includes (1) a defined area on a piezoelectric substrate within which is located an open circuit reflector perpendicular to the SAW direction of propagation; and (2) a pair of low reflectivity transducer electrodes located within the defined area and connected to opposing bus bars, the electrodes perpendicular to the direction of the SAW propagation and positioned with the excitation center of the pair of electrodes located about seven-eighths of a Rayleigh wavelength at a center frequency of the SAW from the reflector.

Thus, the present invention provides for a transducer that will concentrate the energy of the SAW in one direction on a SAW substrate. Such a device is advantageous in the case of such SAW devices as SAW identification tags. For SAW RFID tags, it is desirable to deal with only one set of reflected signals. In addition, the present invention provides for a more vigorous interrogation pulse because the energy generated by the transducer that would have been otherwise discarded is added to the energy of the SAW interrogation pulse.

In one embodiment the invention provides for the defined area to be a distance about equal to twice the Rayleigh wavelength at a center frequency of the SAW, plus the Rayleigh wavelength of a center frequency of the SAW multiplied by a positive integer minus one. In another embodiment the transducer electrodes are separated by a distance of about one-half of the Rayleigh wavelength at a center frequency of the SAW. In still another embodiment the transducer electrodes each have a width of about one-fourth of the Rayleigh wavelength at a center frequency of the SAW.

For manufacturing convenience it is advantageous to use aluminum for both the reflector and the transducer electrodes. An embodiment of the invention provides for the electrodes to have a low total reflectivity. In one of the embodiments of the invention the electrodes have a thickness about equal to one-tenth of the Rayleigh wavelength at a center frequency of the SAW. An advantageous embodiment of the invention provides for the device to have a piezoelectric substrate such that the mechanical reflectivity has an opposite sign as compared to the electrical part of the reflectivity of the pair of electrodes and the reflector. Such a piezoelectric substrate is 128° LiNbO3.

In still another embodiment the width of the electrodes is less than one-quarter wavelength. In yet still another embodiment the width of the reflector is between 0.3 wavelength and 0.5 wavelength.

An advantageous embodiment of the invention provides for at least two open circuit reflectors having a width of about one-fourth wavelength and separated by a distance of about one-half wavelength. In another embodiment of the invention the excitation center of the pair of electrodes, located about seven-eighths of a Rayleigh wavelength at a center frequency of the SAW from the reflector, is varied by an amount equal to plus or minus ten percent of the seven-eighths of a Rayleigh wavelength.

A useful embodiment of the invention provides for a plurality of pairs of electrodes with each of the pairs offset at a distance equal to a number of wavelengths and connected to the same bus bars in the same sequence of polarity. In another embodiment the device is further comprised of a plurality of equivalent reflectors, with each reflector offset at a distance equal to a number of wavelengths from each other such that the reflectors do not overlap the electrodes.

Another useful embodiment of the device provides for it to be further comprised of a periodic set of defined areas. In this embodiment the periodic set of the defined areas are situated quasi-periodically with the period equal to the length of the defined area or greater than the length by an integer number of wavelengths, the wavelength slowly changing (chirped) along the length of the piezoelectric substrate. The invention as described herein is usefully employed as a unidirectional SAW transducer for low loss applications.

Yet another embodiment of the invention provides for a plurality of defined areas placed in parallel acoustic sub channels, separated by a wavelength, perpendicular to the propagation direction of the wave, and electrically connected in parallel.

Of course a particularly useful application of the invention is for use in SAW identification tags. Thus, the device described herein is usefully employed when the defined space is located on a SAW identification tag.

An extremely useful embodiment of the invention provides for a SAW device that is comprised of (1) a piezoelectric substrate with a SAW transducer located thereon; and (2) a reflector on the substrate for reflecting a response to an interrogation pulse generated by the SAW transducer, the reflector arranged on the substrate to substantially match the diffraction field of the interrogation pulse. In one embodiment the reflector is located in the far field of the interrogation pulse while in another it is located in the near field.

Of course, the device may further be comprised of a plurality of reflectors arranged on the substrate. In such case, at least one of the plurality of reflectors may be located in the near field and at least one of the plurality of reflectors located in the far field of the interrogation pulse and still be within the intended scope of the present invention.

The invention also provides for the reflector to be curved to substantially match a contour of constant phase in the diffraction field of the interrogation pulse. In still another embodiment, the reflector is curved to substantially match a contour of constant amplitude in the diffraction field of the interrogation pulse. In yet still another embodiment the reflector is curved to substantially match both the contour of constant phase and the contour of constant amplitude in the diffraction field of the interrogation pulse. A particularly useful embodiment provides for the reflector to be segmented to form a substantial curvature shape and substantially match either the contour of constant phase or the contour of constant amplitude in the diffraction field of the interrogation pulse.

The present invention can also be usefully employed to cause the reflector to focus a reflected pulse at the transducer such that the reflected signal substantially matches the amplitude and phase distribution of the interrogation pulse.

The invention can be usefully employed when the reflector is an either an open circuit metallic strip or a short circuit. It can also be usefully employed when in the case of non-metallic reflectors. A useful embodiment of the invention provides for the reflector to be segmented. In the case of a segmented reflector, a useful embodiment provides for a space between each of the segments that is about equal to one-quarter of a wavelength. In another embodiment the reflector is designed to encompass the main lobe and first sidelobes of the interrogation pulse. In an embodiment where the reflector encompasses the main lobe and first sidelobes of the interrogation pulse, eight segments are used for the main lobe and four segments are used for each of the sidelobes for a total of sixteen segments.

A significant embodiment of the invention provides for a SAW device that has (1) a piezoelectric substrate with a SAW transducer located thereon; and (2) a reflector on the substrate for reflecting a response to an interrogation pulse generated by the SAW transducer, where the reflector is arranged on the substrate in a substantially curvature configuration to substantially match the amplitude and phase of the diffraction field of the interrogation pulse.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
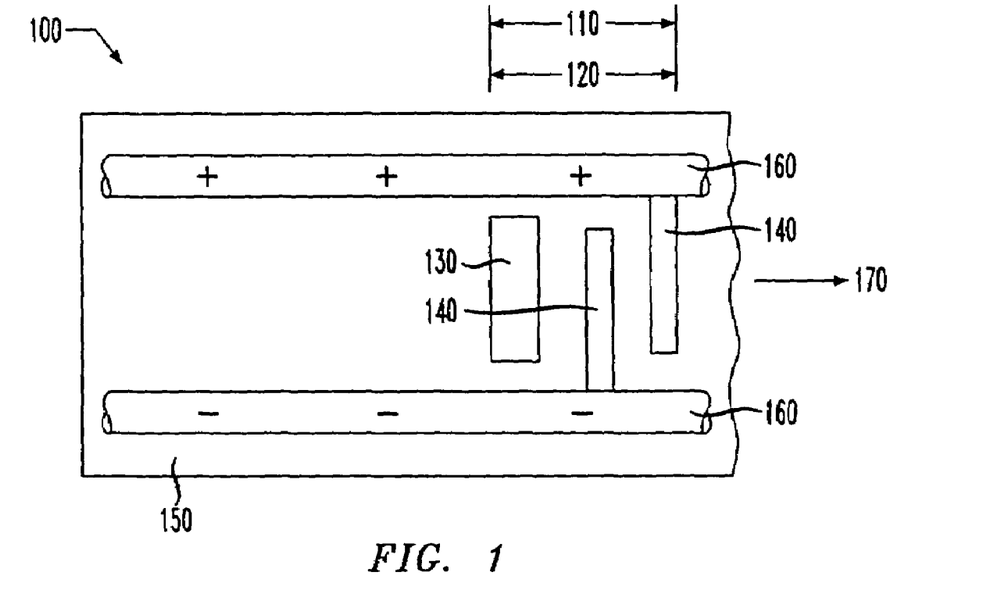
FIG. 1 illustrates a unidirectional transducer device constructed in accordance with the present invention.

Referring initially to FIG. 1, illustrated is a unidirectional transducer device 100 constructed in accordance with the present invention. Shown is a top view of a piezoelectric substrate 150 that has cell 110 located on its surface 155. The cell 110 has a length 120 of about twice the SAW Rayleigh wavelength (determined at the center frequency of the SAW that is generated on the piezoelectric substrate 150). Shown in the cell 110 is a strongly reflecting one-half wavelength wide floating or open circuit reflector 130 and a weakly reflecting pair of one-quarter wavelength wide electrodes 140 used to excite SAWs on the piezoelectric substrate. Each of the electrodes 140 is connected to a bus bar 160 such that the electrodes 140 are connected to bus bars 160 of opposite polarity. The illustrated device 100 with a pair of electrodes 140 connected to bus bars 160 of opposite polarity whereby the internal reflection of the floating reflector 130 is used to cause the electrodes 140 to be a unidirectional SAW transducer.

This invention provides for a unidirectional SAW transducer constructed on a piezoelectric substrate 150 in a space that has a length 120 of about twice the Rayleigh wavelength at the center frequency of the SAW plus the Rayleigh wavelength multiplied by a positive integer minus one. Within the embodiment illustrated in FIG. 1, the positive integer is assumed to be one, thus the length 120 is equal to twice the Rayleigh wavelength. The direction of propagation 170 of the SAW is from left to right. The electrodes 140, which can be aluminum, are located about perpendicular to the direction of propagation 170 and are separated by a distance of about one-half a Rayleigh wavelength. Each of the electrodes 140 is about one-fourth a Rayleigh wavelength wide and each is, respectively, connected to a bus bar 160 of opposite polarity.

Located within the cell 110, is the open circuited reflector 130 (which can be aluminum) oriented parallel to the pair of electrodes 140. The reflector 130 is positioned so that the center of reflection is located at a distance of about seven-eighths of a wavelength from the excitation center of the pair of electrodes 140, which is taken to be the center of the gap between the electrodes 140. The predominant direction of the SAW being from the reflector 130 towards the pair of electrodes 140.

In some piezoelectric substrates 150 the mechanical part of reflectivity has an opposite sign compared to that of the electrical part of reflectivity. The use of such piezoelectric substrates 150 achieves low losses for one-quarter wavelength wide floating or short-circuited reflectors 130 and electrodes 140 because of the substantial cancellation of the electrodes 140 total reflectivity. An example of such a substrate material is 128° LiNbO$_3$ where one-quarter wavelength wide electrodes 140 are weakly reflecting for aluminum electrode 140 thicknesses that equal about 0.1% to 10% of a wavelength. Aluminum based alloys, such as AlCu with a low percentage of Cu, and others can also be used as the material for the reflectors and electrodes. To achieve maximum reflectivity, the width of the open-circuited reflector 130 is between within 0.3 of a wavelength and 0.5 of a wavelength. The center of reflection is at the approximate center of the wide short circuit or floating reflector 130 and the center of excitation is at the center of the gap between the one-quarter wavelength wide electrodes 140. The nominal distance from the reflection center to the excitation center can be varied within ±10% of a wavelength by adjusting the position of the reflector 130 within the cell 110 by a corresponding shift to find optimal unidirectionality. In FIG. 1, the SAW is predominantly propagated to the right. A comparison of the generated and reflected forward propagating waves (ignoring the reflectivity of the one-quarter wavelength wide fingers in the electrodes 140) within the cell 110 shows that the phase difference equals $4\pi$, and thus the propagated waves interfere constructively. The phase of the reflection coefficient is $+\pi/2$, with reference point at the center of an open reflector on 128° LiNbO3. For the opposite direction, the phase difference between the generated and the reflected signals is $5\pi$, and they tend to cancel each other. All critical dimensions in this structure, including gaps, are on the order of one-quarter of a wavelength.

Where 128° LiNbO3 is used with one-quarter wavelength wide electrodes 140, the electrodes 140 are weakly reflecting for metal thicknesses 0.1 to 10% of a wavelength. In practice, for 128° LiNbO3, aluminum thicknesses ranging from 1% to 8% are most suitable for the purposes of this invention. The thickness range is limited by increased resistivity for low thicknesses and by difficulties in producing high-aspect-ratio aluminum profiles for high thicknesses. Moreover, for each particular thickness, a metallization ratio (a/p) corresponding to vanishing reflectivity of the electrodes 140 can be found or determined.

For example, in a short-circuited long grating, the reflection coefficient for a/p=0.5 is close to zero for the relative aluminum thickness of 2.5%. For higher thicknesses, the metallization ratio has to be decreased to attain low reflectivity. For a single one-half wavelength wide floating or open circuit reflector 130, the reflection coefficient is found to be significantly higher than that for short circuited one-quarter wavelength wide electrodes 140, the maximum occurring for metallization ratios a/p of between 0.3 and 0.5.

It is evident that similar approaches can be applied to other substrates and materials for electrodes and reflectors exhibiting properties of opposite sign mechanical and electrical reflectivity. Another example that satisfies this criterion is YZ-LiNbO3. A significant feature of the invention is the use of the above-described structures as weakly reflecting electrodes 140 and strong reflectors 130.

Figure 2:
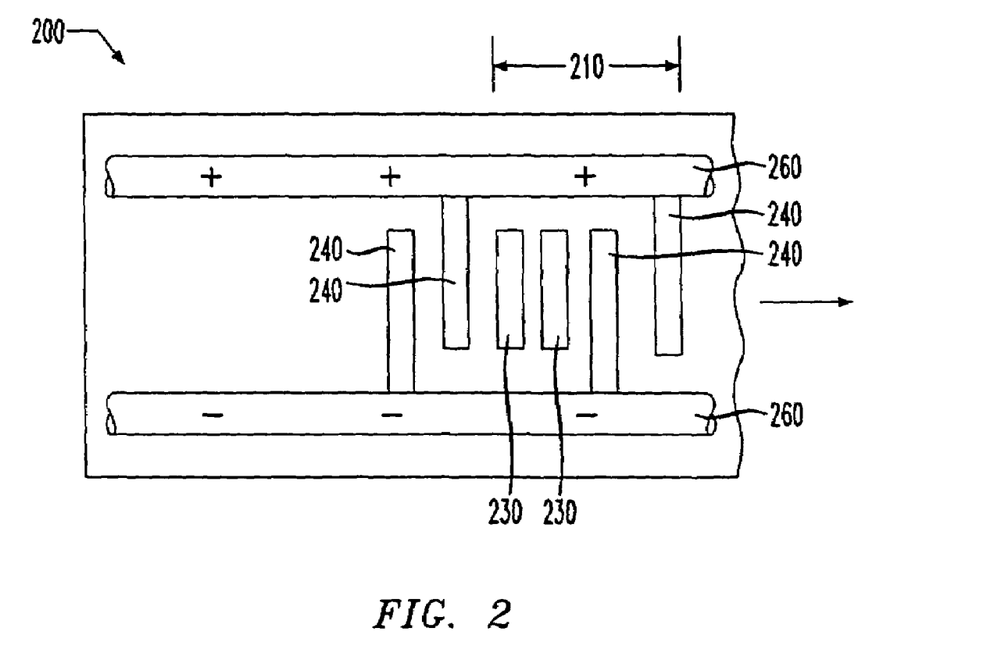
FIG. 2 illustrates a variant of a unidirectional transducer constructed in accordance with the present invention utilizing more than one pair of electrodes.

Turning now to FIG. 2, illustrated is an embodiment of a unidirectional transducer device 200 utilizing a transduce with a pair of reflectors 230. In this embodiment, the cell 210 has a pair of floating or open circuit reflectors 230 with each reflector 230 in the pair having a width approximating one-quarter wavelength. There is a separation between each of the reflectors 230 in the pair of about one-half wavelength. The center of reflection is taken to be in the middle of the separation between the two reflectors 230. The nominal distance from the reflection center to the excitation center of the electrodes 240 is seven-eighths of a wavelength and can be varied within ±10% of a period of the transducer electrodes 240 by adjusting the position of the reflectors 230 within the unit cell 210 by a corresponding shift to find the optimal unidirectionality. The pair of reflectors 230 is placed between two pairs of transducer electrodes 240 which are sequentially connected to two bus bars 260. The critical dimension of this structure is on the order of one-eighth of a wavelength, which renders this structure less attractive for high-frequency applications than the structure described above with respect to FIG. 1.

Figure 3:
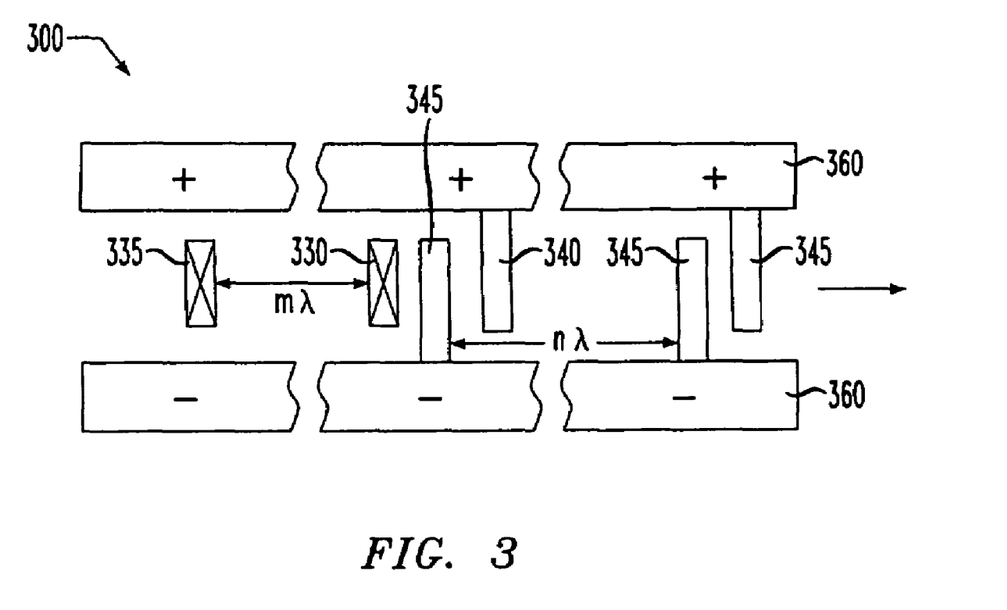
FIG. 3 illustrates the adjustment of the transduction and reflectivity of a SAW device by utilizing a plurality of pairs of transducer electrodes and reflectors.

Turning now to FIG. 3, illustrated is an embodiment where the SAW device 300 includes at least one more pair of electrodes 345 that are essentially equivalent to the first pair of electrodes 340 with each of the additional electrode 345 pairs offset at a distance of a number of wavelengths from the first pair of electrodes and connected to the same bus bars 360 in the same sequence of polarity as the first pair of electrodes 340.

In another embodiment, the SAW device includes at least one more reflector 345 essentially equivalent to the first reflector 340, each of the additional reflectors 335 offset at a distance of a number of wavelengths from the first reflector 330, and, if the additional pairs of electrodes 345 are present, the number of wavelengths (m) will be m≠n+1 to avoid overlapping the reflectors 330, 335 with the transducer electrodes 340, 345. Here, positive n, m correspond to a shift towards the right. This procedure allows one to vary the number of transducer pairs of electrodes 340, 345 and reflectors 330, 335 along the structure, thus creating weighted unidirectional structures with improved performances.

Figure 4:
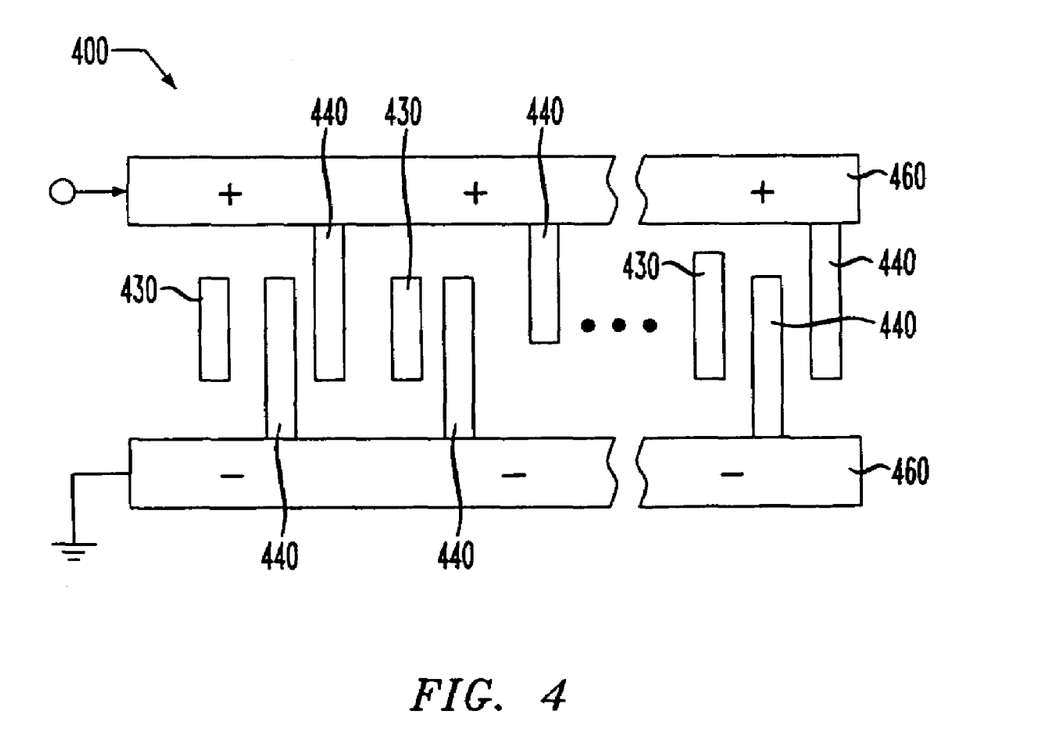
FIG. 4 illustrates a basic unidirectional SAW transducer constructed in accordance with the present invention utilizing periodically distributed SPUDT cells of the type illustrated in FIG. 1.

Turning now to FIG. 4, illustrated is a SAW device 400 that includes a periodic set of identical sections described in FIG. 1, wherein transducer electrodes 440 are connected periodically to bus bars 460 of opposite polarity, with a period equal to two wavelengths. Here, in each section, only one pair of electrodes 440 is used and the reflector 430 only comprises one one-half wide wavelength and is floating or open-circuited. This embodiment corresponds to an unweighted unidirectional SAW transducer. It is evident that in a single-ended circuitry, the signal is connected to one of the bus bars 460 and the other busbar 460 is grounded. This unidirectional transducer can be used for generation of SAWs with low losses and has numerous applications as such, e.g., for SAW sensors, actuators, et cetera.

Figure 5:
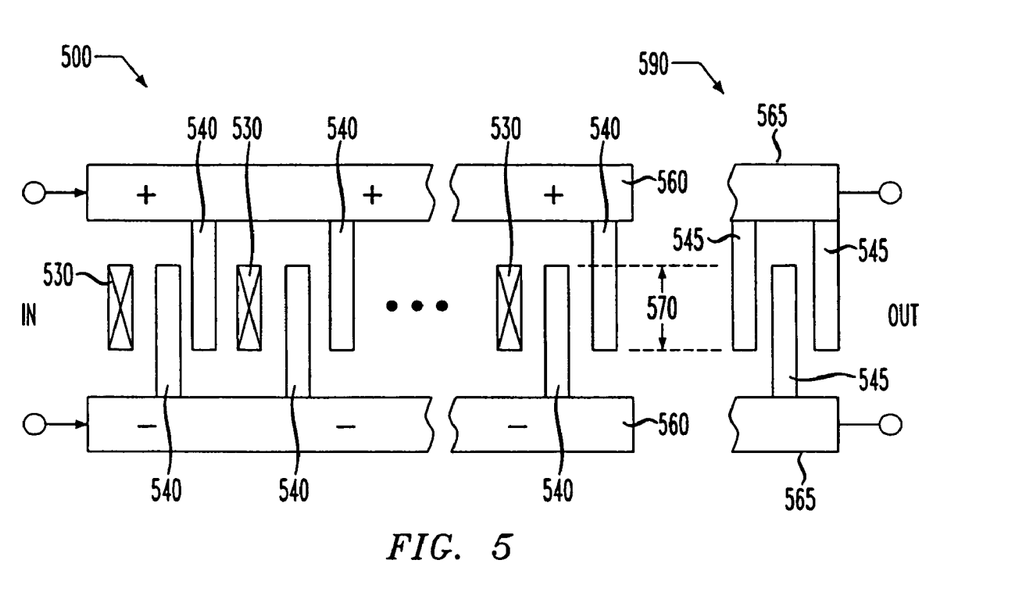
FIG. 5 illustrates a SAW filter utilizing at least one unidirectional transducer constructed in accordance with the present invention.

Turning now to FIG. 5, illustrated is an embodiment of the invention for filter applications, wherein at least one unidirectional SAW transducer 500 is connected to input bus bars 560, operating as an input transducer and generating SAWs in some acoustical channel 570, and a receiving transducer 590, illustrated schematically, connected to the output bus bars 565 placed in the same acoustic channel 570. It should be noted that the receiving transducer 590 has more than two electrodes 545. It should also be noted that a transducer may have any number of electrodes in any of the embodiments of the present invention and still be within the intended scope of the invention.

Figure 6:
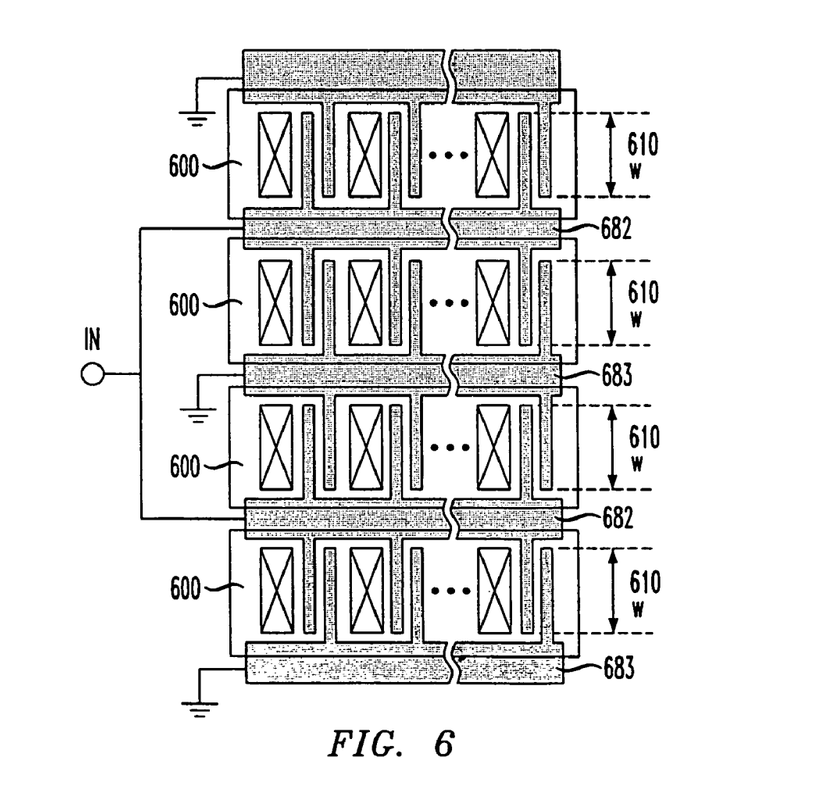
FIG. 6 illustrates parallel-connected SAW transducers generating surface acoustic waves in a common acoustic channel.

Turning now to FIG. 6, illustrated is an embodiment of the invention where at least two unidirectional SAW transducers 600 are placed in parallel acoustic subchannels 610 of aperture W, separated by a distance comparable to the wavelength in the direction perpendicular to the propagation direction of the wave, and electrically connected in parallel. In the particular case shown, four unidirectional transducers are connected in parallel. The transducers are separated by narrow bus bars 682, 683, having widths on the order of one wavelength. The SAWS generated by all transducers towards the forward direction (to the right) create a single acoustic beam with the total aperture close to 4 W. Parallel connection of said transducers decreases the resistive and diffractional losses.

Figure 7:
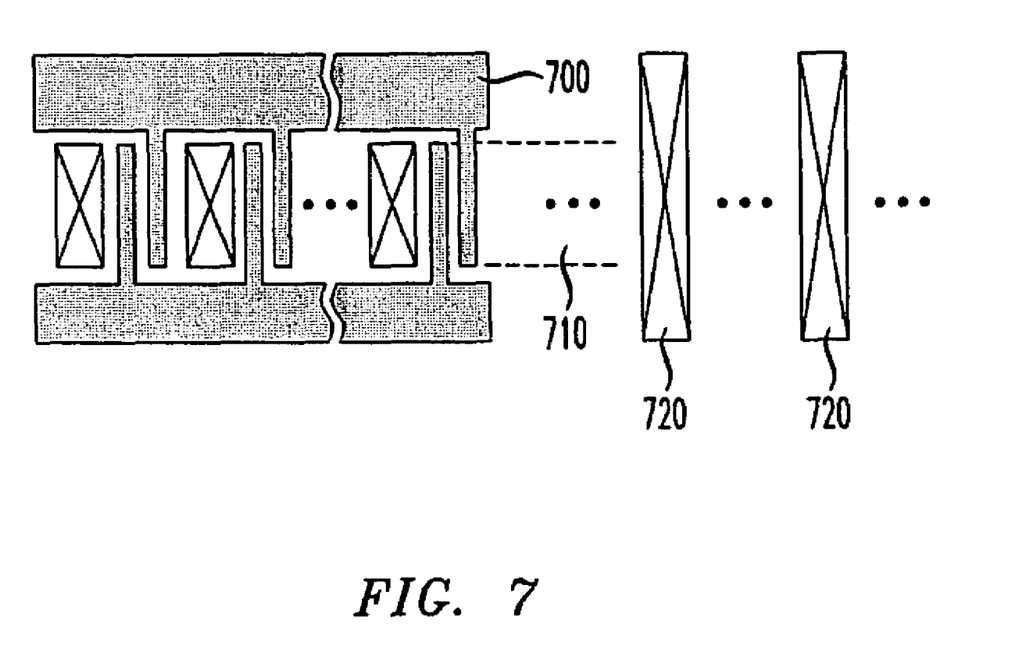
FIG. 7 illustrates a SAW tag utilizing at least one unidirectional transducer constructed in accordance with the present invention.

Illustrated in FIG. 7 is a SAW device used for SAW tag application wherein one unidirectional transducer 700 and SAW identification tags 720 are applied in the acoustic channel 710 to create response signals corresponding to the identification code of the device bearing such saw identification tags 720.

It is evident that several known solutions used in SAW devices can be applied to the present invention. For example, said unidirectional transducer can be chirped, i.e., it includes a number of said sections, situated quasi-periodically with the period equal to the length of the section or greater than the length of the section by an integer number of wavelengths, the wavelength slowly changing along the length of the structure.

Another possibility is the use of a fan-shaped structure. It is clear for a person skilled in the art that such standard variants are included in the scope of this invention.

The use of one-fourth wavelength and wider electrodes in the present invention allows the manufacturing of the devices with the standard lithographic techniques up to the frequency range of 2-3 GHz. The use of wide and floating electrodes as reflectors dramatically decreases the resistive losses, especially in applications where a wide aperture is important, such as SAW tags.

Figure 8A:
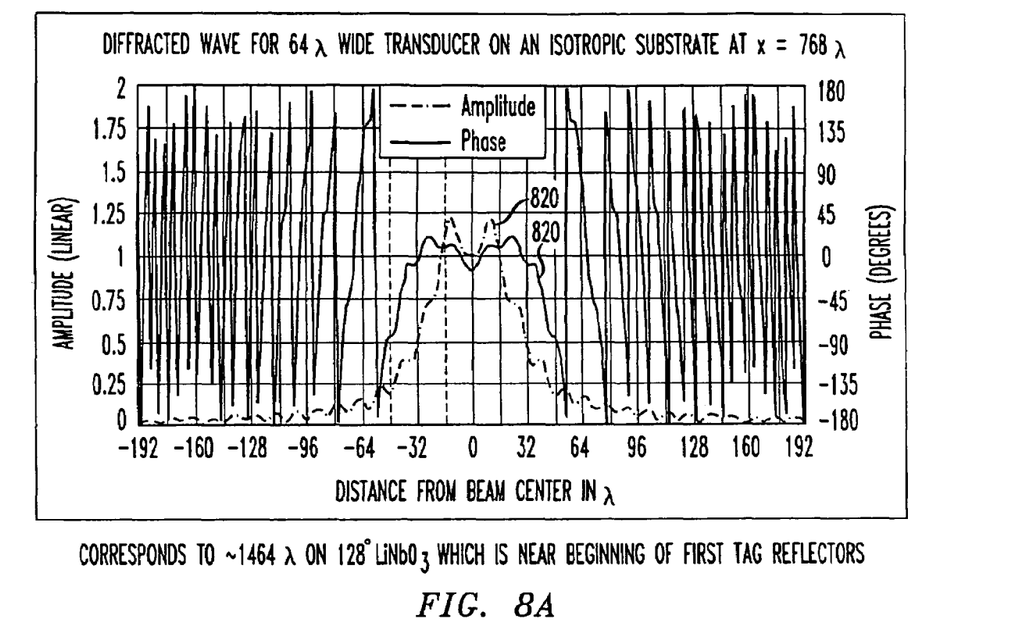
FIGS. 8A-8F illustrate diffracted wave forms for amplitude and phase of an interrogation pulse on a piezoelectric substrate at various distances from a transducer.
Figure 8B:
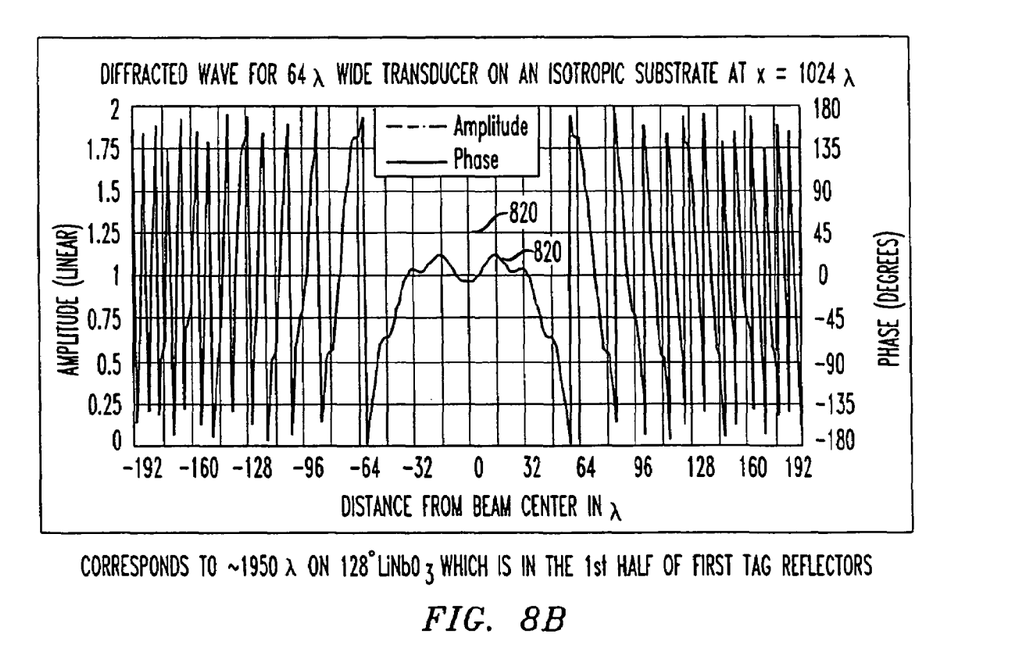
Figure 8C:
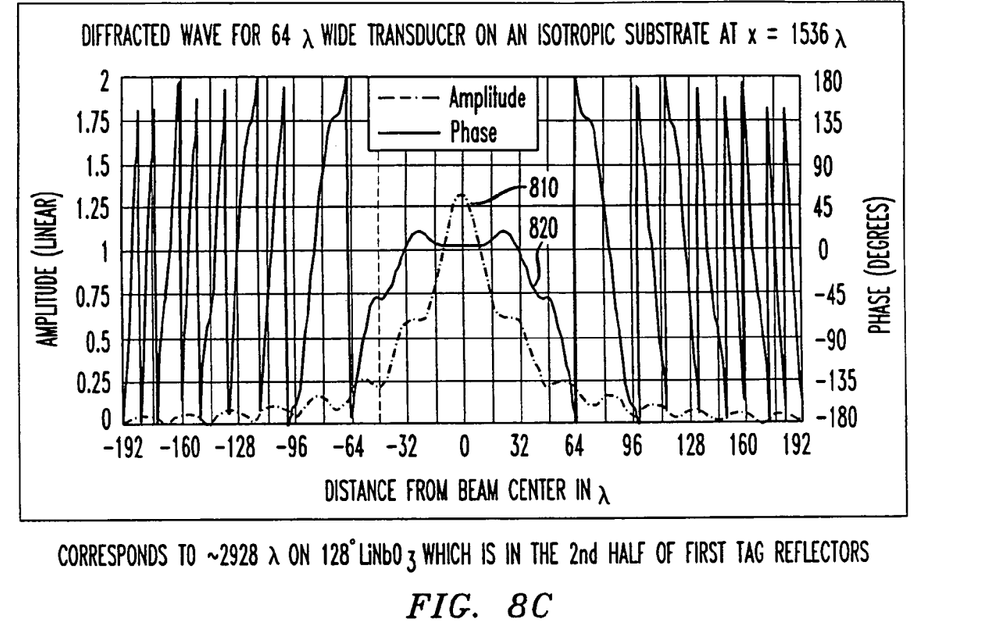
Figure 8D:
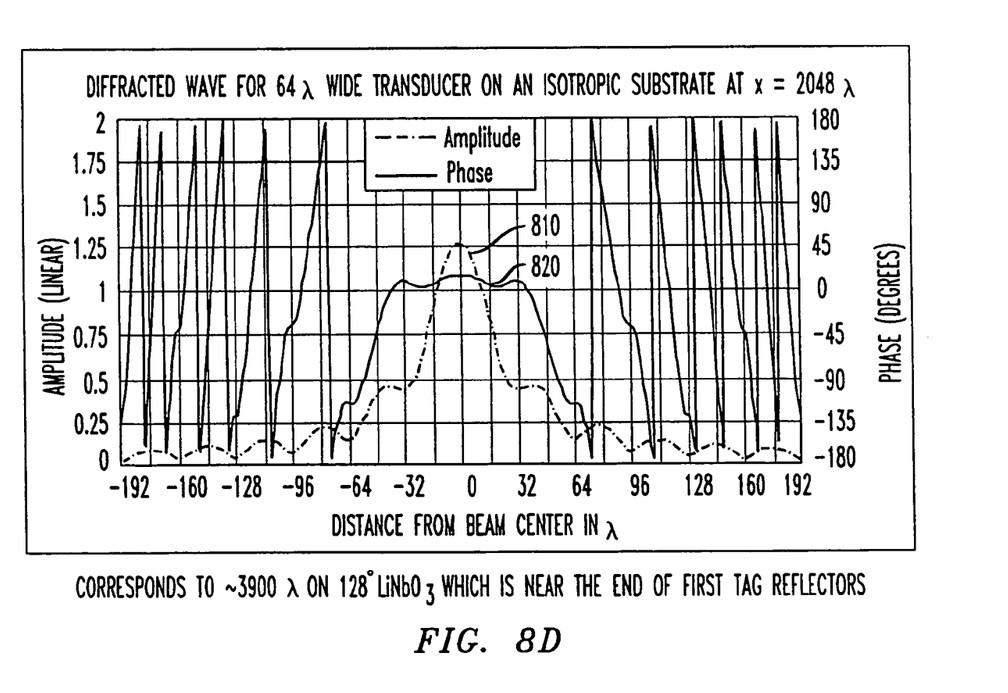
Figure 8E:
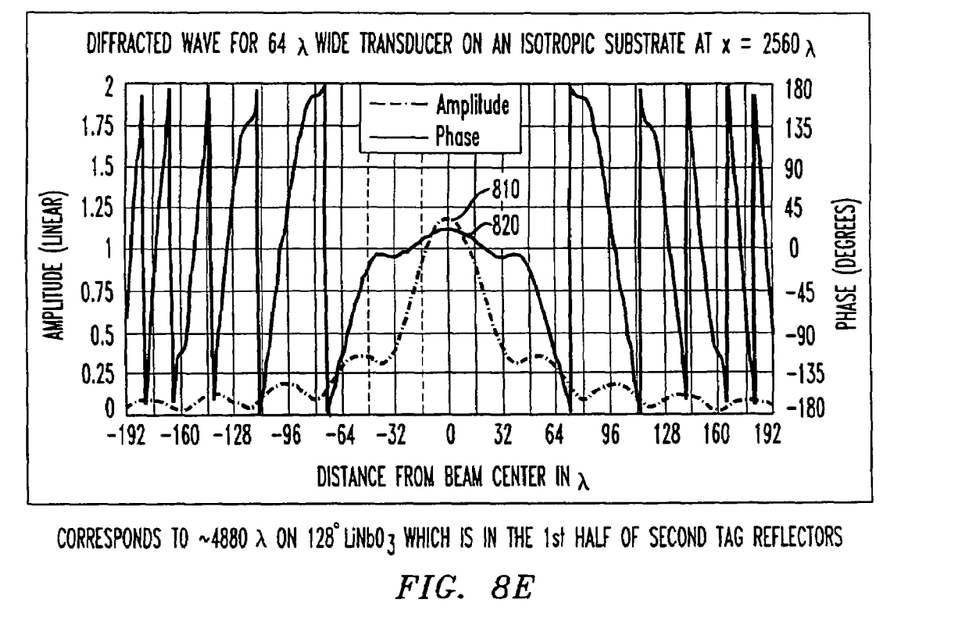
Figure 8F:
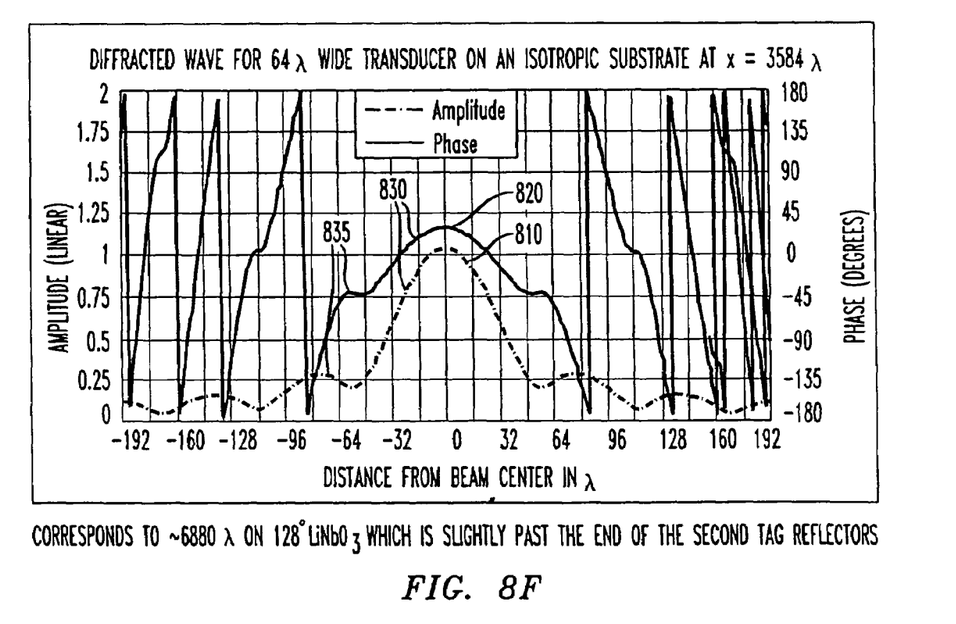

Turning now to FIGS. 8A-8F, illustrated are diffracted wave forms for amplitude 810 and phase 820 of an interrogation pulse on a piezoelectric substrate at various distances from a transducer. Dealing with the two extremes, illustrated in FIG. 8A is a near field waveform and in FIG. 8F is a far field waveform. As can be seen in FIG. 8F, as the interrogation pulse gets further from the transducer, it spreads and diffuses. FIG. 8F shows that both the amplitude 810 and phase 820 of the pulse have a main lobe 830 and sidelobes 835, which appear as shoulders to the main lobe 830. These lobes 830, 835 constitute the majority of the energy that will be reflected. It is beneficial to try to capture as much as this reflected energy as possible.

Figure 9:
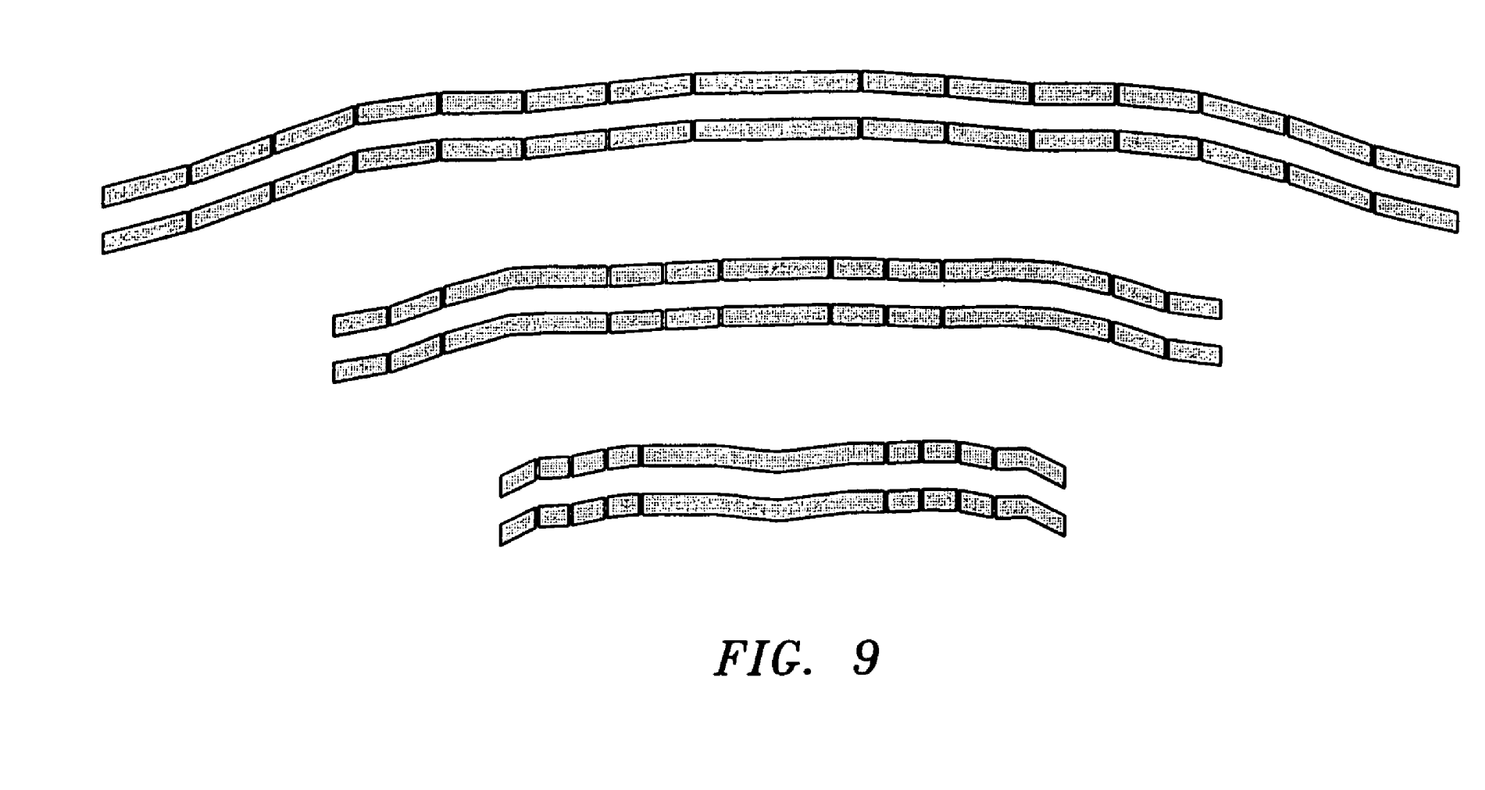
FIG. 9 illustrates a reflector on a piezoelectric constructed in accordance with the present invention that is arranged to substantially match the diffraction field of the interrogation pulse.
Figure 10:
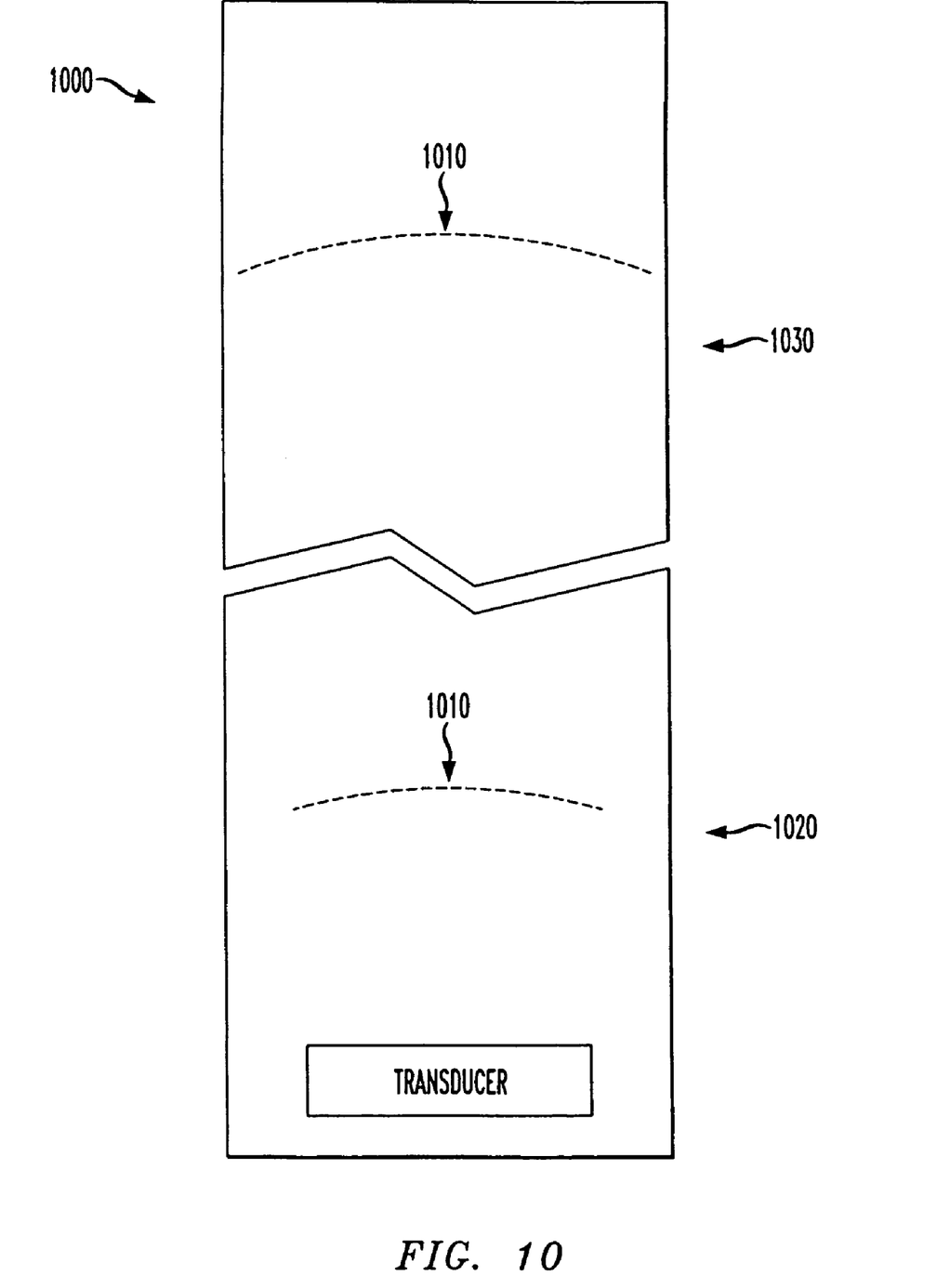
FIG. 10 is a representative SAW tag using reflectors of the type illustrated in detail in FIG. 9.

Turning now to FIG. 9, illustrated is a reflector on a piezoelectric constructed in accordance with the present invention that is arranged to substantially match the diffraction field of the interrogation pulse. Illustrated in FIG. 10, is a representative SAW tag 1000 using reflectors 1010 of the type illustrated in detail in FIG. 9. As illustrated, a reflector 1010 constructed in accordance with the present invention can be used in either the near field 1020 of the interrogation pulse to capture the energy depicted in FIG. 8A, or in the far field 1030 to capture the energy depicted in FIG. 8F. Of course, a plurality of such reflectors 1010 will be generally used in the case of a SAW RFID tag 1000, which means that a reflector 1010, or reflectors 1010, of the type described herein may be used in the near field 1020 on a substrate and others in the far field 1030 on the same substrate, all of which is within the intended scope of the present invention.

As illustrated in FIG. 9, the reflector will be shaped or curved to substantially match the contour of constant phase or contour of constant amplitude, or both, in the diffraction field of the interrogation pulse. Of course, if non-metallic reflectors are used or if the reflectors are not electrically isolated, in the case of metallic reflectors, it is only necessary to match the contour of constant phase of the interrogation pulse.

There can be a substantial advantage to segmented the reflector to form the fundamentally curvature shape that matches the contour of constant phase or the contour of constant amplitude in the diffraction field of the interrogation pulse. It is advantageous from a manufacturing viewpoint since it is more difficult to form curves that match the signal contours than using small straight lines to approximate it. Another advantage of segmentation, in the case of metallic reflectors, is that the voltage in the reflector can be more easily controlled. In one embodiment of the invention it has been found to be advantageous to segment the reflector into segments separated by spaces approximating one-quarter of the central frequency of the SAW being propagated by the transducer.

Another advantage of curving the reflector is that it permits the reflected signal to be focused in a manner that allows the response pulse to have the same approximate shape as the interrogation pulse when it is detected by the transducer. Thus the response pulse will have substantially the same phase and amplitude as the portion of the interrogation pulse that reaches the reflector.

The design described herein can be used for both open circuit reflectors or short circuit reflectors. It can also be used for non-metallic reflectors. In the case of non-metallic and short circuit metallic reflectors it is only necessary to match the contour of constant phase of the interrogation signal.

As can be seen from FIG. 8F, it is advantageous for the reflector to encompass encompasses the main lobe 830 and first sidelobes 835 of the interrogation pulse. Of course in the case of a near field reflector, as can be seen from FIG. 8A, it is only necessary for the reflector to encompass the main lobe 830, since the sidelobes 835 are virtually undistinguishable. It has been found to be advantageous, in the case of the far field when a segmented reflector is used, to use four segments for each of the sidelobes 835 and eight segments for the main lobe 830, for a total of sixteen segments in the reflector.

Figure 11:
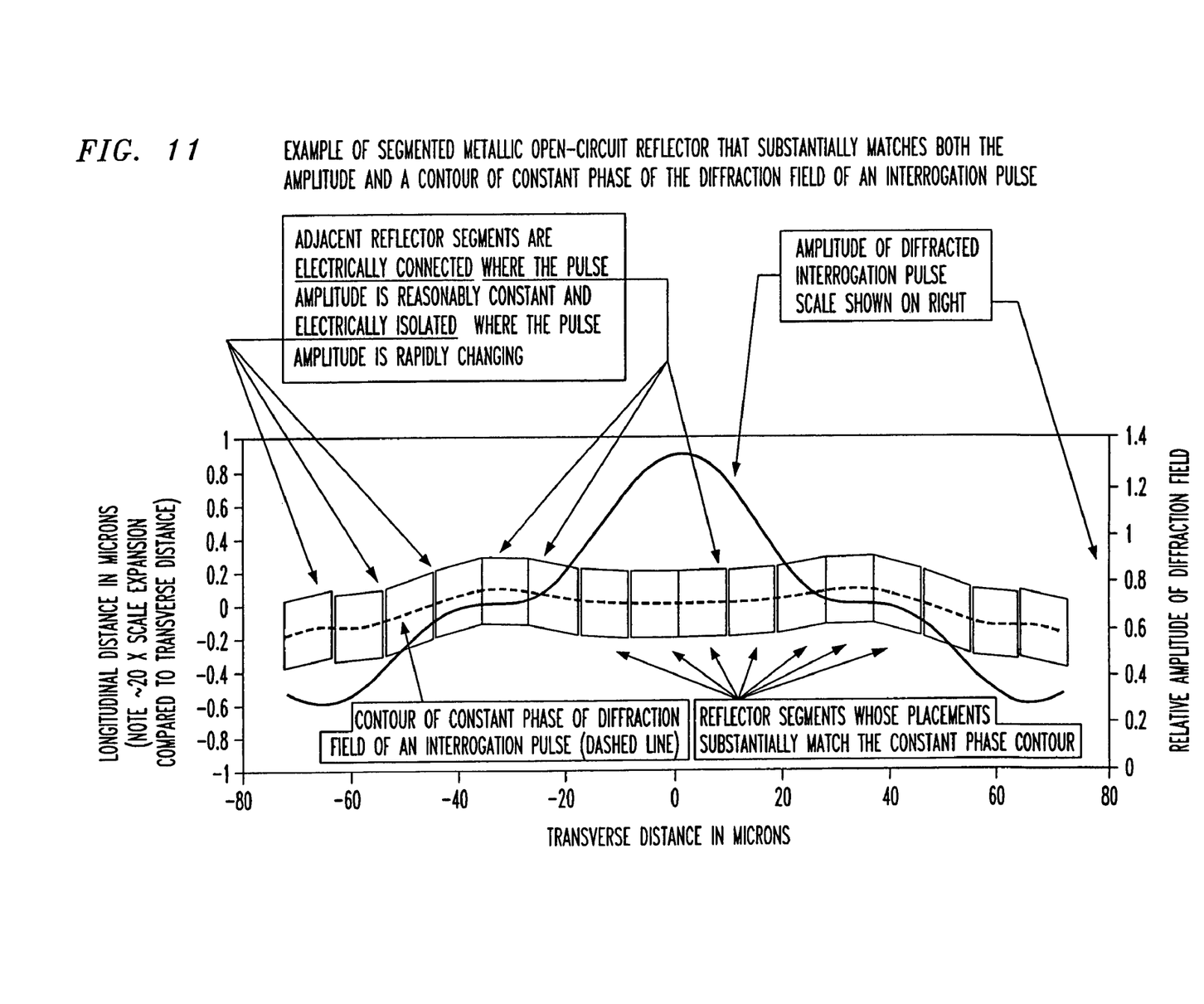
FIG. 11 illustrates a representative example of a segmented metallic open-circuit reflector constructed in accordance with the present invention that substantially matches both the amplitude and a contour of constant phase of the diffraction field of an interrogation pulse.

Turning to FIG. 11, illustrated is a representative example of a segmented metallic open-circuit reflector constructed in accordance with the present invention that substantially matches both the amplitude and a contour of constant phase of the diffraction field of an interrogation pulse.

Although the present invention has been described in detail, those skilled in the art should understand that they can make various changes, substitutions and alterations herein without departing from the spirit and scope of the invention in its broadest form.

What is claimed is:

1. A SAW device, comprising:
a piezoelectric substrate having a SAW transducer located thereon; and
a reflector on said substrate for reflecting a response to an interrogation pulse generated by said SAW transducer, said reflector arranged on said substrate to substantially match the diffraction field of said interrogation pulse.

2. The device as recited in claim 1 wherein said reflector is located in the far field of said interrogation pulse.

3. The device as recited in claim 2 wherein said reflector is located in the near field of said interrogation pulse.

4. The device as recited in claim 2 further comprising a plurality of reflectors arranged on said substrate.

5. The device as recited in claim 4 wherein at least one of said plurality of reflectors is located in the near field and at least one of said plurality of reflectors is located in the far field of said interrogation pulse.

6. The device as recited in claim 2 wherein said reflector is curved to substantially match a contour of constant phase in the diffraction field of said interrogation pulse.

7. The device as recited in claim 2 wherein said reflector is curved to substantially match a contour of constant amplitude in the diffraction field of said interrogation pulse.

8. The device as recited in claim 2 wherein said reflector is curved to substantially match the contour of constant phase and the contour of constant amplitude in the diffraction field of said interrogation pulse.

9. The device as recited in claim 2 wherein said reflector is segmented to form a substantial curvature shape to substantially match either the contour of constant phase or the contour of constant amplitude in the diffraction field of said interrogation pulse.

10. The device as recited in claim 9 wherein said reflector focuses a reflected pulse at said transducer that substantially matches the amplitude and phase distribution of said interrogation pulse generated by said transducer.

11. The device as recited in claim 2 wherein said reflector is an open circuit metallic strip.

12. The device as recited in claim 2 wherein said reflector is an short circuit metallic strip.

13. The device as recited in claim 2 wherein said reflector is non-metallic.

14. The device as recited in claim 2 wherein said reflector is segmented.

15. The device as recited in claim 14 wherein the space between each of said segments is about equal to one-quarter of a wavelength.

16. The device as recited in claim 2 wherein said reflector encompasses the main lobe and first sidelobes of said interrogation pulse.

17. The device as recited in claim 7 wherein said reflector encompasses the main lobe and first sidelobes of said interrogation pulse and eight segments are used for said main lobe and four segments are used for each of said sidelobes.

18. A SAW device, comprising:
a piezoelectric substrate having a SAW transducer located thereon; and
a reflector on said substrate for reflecting a response to an interrogation pulse generated by said SAW transducer, said reflector arranged on said substrate in a substantially curvature configuration to substantially match the amplitude and phase of the diffraction field of said interrogation pulse.

* * * * *